United States Patent
Wei et al.

(10) Patent No.: US 8,581,205 B2
(45) Date of Patent: Nov. 12, 2013

(54) TRANSMISSION ELECTRON MICROSCOPE MICRO-GRID

(75) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 326 days.

(21) Appl. No.: 13/174,878

(22) Filed: Jul. 1, 2011

(65) Prior Publication Data

US 2012/0261588 A1    Oct. 18, 2012

(30) Foreign Application Priority Data

Apr. 14, 2011    (CN) .......................... 2011 1 0092686

(51) Int. Cl.
*G01F 23/00*    (2006.01)
*G21K 5/08*    (2006.01)
*G21K 5/10*    (2006.01)
*H01J 37/20*    (2006.01)

(52) U.S. Cl.
USPC ...................................................... 250/440.11

(58) Field of Classification Search
USPC ................. 250/440.11, 443.1, 311, 306, 307, 250/491.1
See application file for complete search history.

(56) References Cited

U.S. PATENT DOCUMENTS 8,387,227 B2 *    3/2013    Liu et al. .......................... 29/458
2010/0181482 A1 *    7/2010    Zhang et al. ................... 250/311

* cited by examiner

*Primary Examiner* — Jack Berman
*Assistant Examiner* — Meenakshi Sahu
(74) *Attorney, Agent, or Firm* — Altis & Wispro Law Group, Inc.

(57) ABSTRACT

A transmission electron microscope (TEM) micro-grid includes a grid and a carbon nanotube composite film covered thereon. The carbon nanotube composite film includes a carbon nanotube film and a layer of nano-materials coated thereon. The carbon nanotube composite film covers a surface of the grid. The nano-material layer is coated on a surface of each of the plurality of carbon nanotubes.

20 Claims, 10 Drawing Sheets

TRANSMISSION ELECTRON MICROSCOPE MICRO-GRID

CROSS-REFERENCE TO RELATED APPLICATIONS

This application claims all benefits accruing under 35 U.S.C. §119 from China Patent Application No. 201110092686.8, filed on 2011 Apr. 14, in the China Intellectual Property Office, the disclosure of which is incorporated herein by reference.

BACKGROUND

1. Technical Field

The present disclosure relates to transmission electron microscope micro-grids, and particularly to a transmission electron microscope micro-grid based on carbon nanotubes.

2. Description of Related Art

With the development of nanotechnology, micro-grids are becoming ubiquitous in the field of electron microscopy. The current transmission electron microscopy (TEM) micro-grid includes a metal mesh net and a carbon nanotube film located on a surface of the metal mesh net. In use, the sample is adhered to a surface of the carbon nanotube film and the background noise from the amorphous carbon film is avoided. However, because the specimen is directly supported by the carbon nanotube, when the TEM micro-grid is used to observe the carbon nanotube samples, the carbon nanotube samples and the carbon nanotubes in the micro-gird are indistinguishable. Thus, the current transmission electron microscopy micro-grid cannot be effectively used to directly observe the carbon nanotube samples.

What is needed, therefore, is to provide a transmission electron microscopy micro-grid that can be used to directly observe the carbon nanotube samples.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
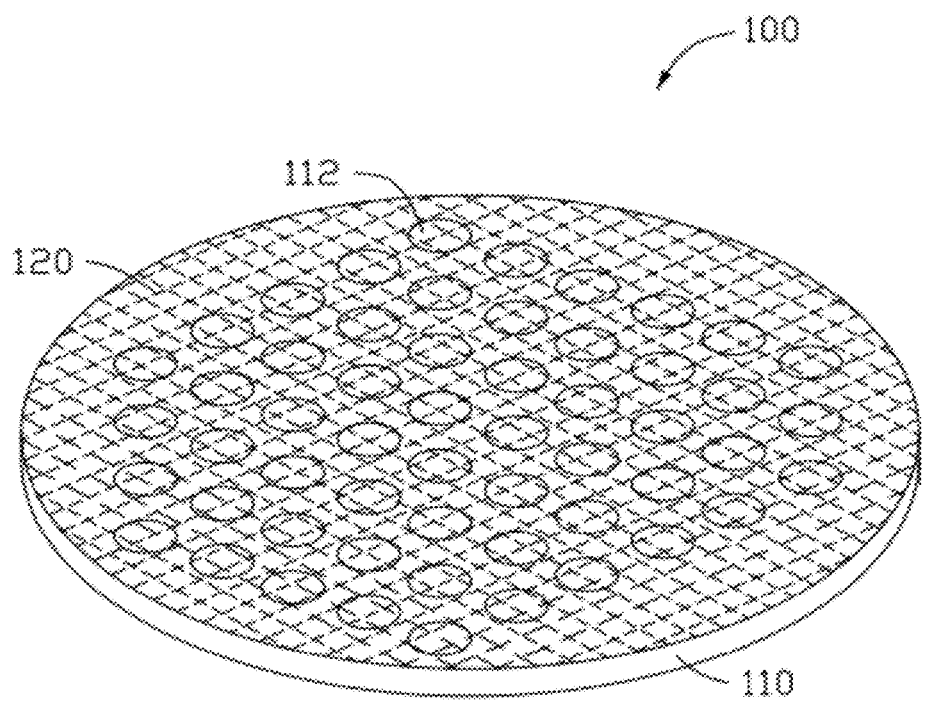
FIG. 1 is a schematic view of one embodiment of a transmission electron microscope (TEM) micro-grid.
Figure 2:
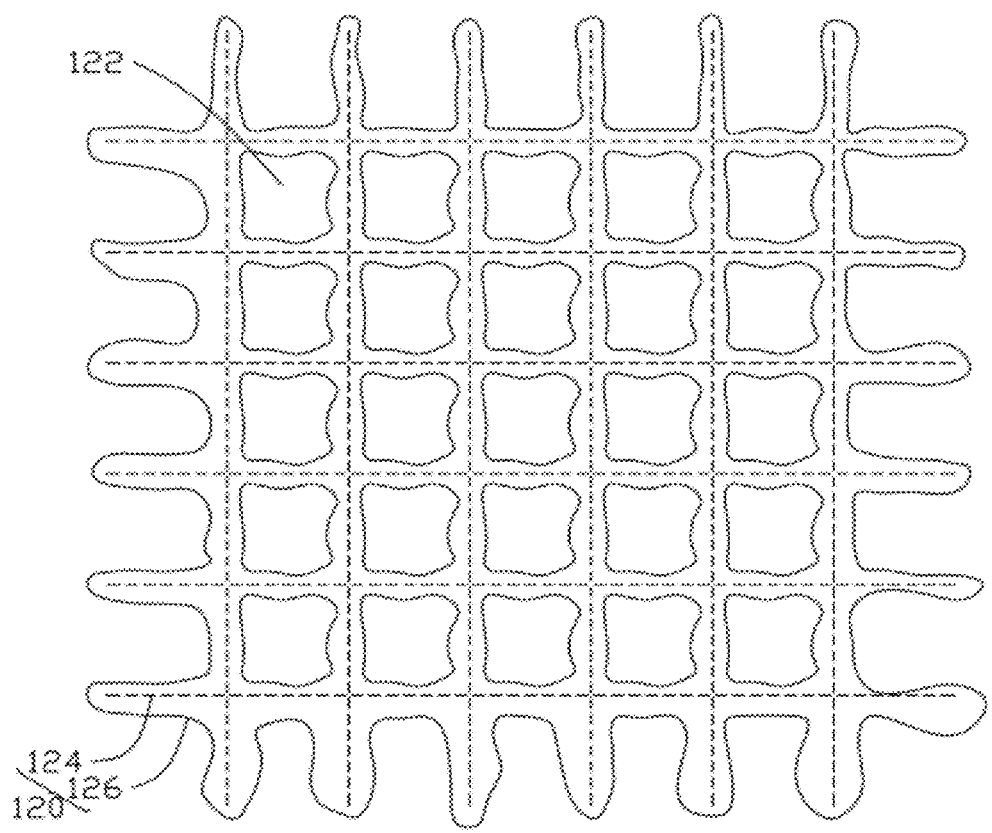
FIG. 2 is a schematic view of one embodiment of a carbon nanotube composite film.

Referring to FIGS. 1 and 2, one embodiment of a TEM micro-grid 100 includes a support 110 and a carbon nanotube composite film 120 stacked with each other. The carbon nanotube composite film 120 includes a plurality of carbon nanotubes 124 and a nano-material layer 126 coated on a surface of the carbon nanotubes 124. The plurality of the carbon nanotubes 124 is interconnected with each other to form a carbon nanotube film structure. The carbon nanotube composite film 120 defines a plurality of micropores 122.

Figure 3:
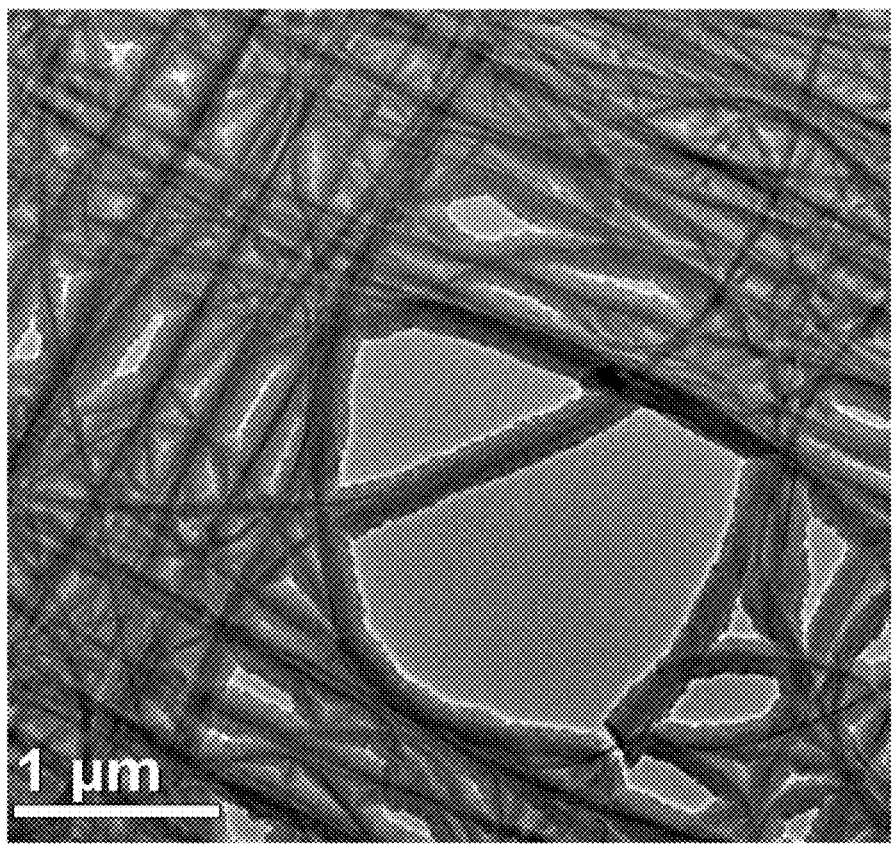
FIG. 3 is a Scanning Electron Microscope (SEM) image of one embodiment of a carbon nanotube composite film.

Further referring to FIG. 3, the carbon nanotube composite film 120 includes the plurality of carbon nanotubes 124 crossed with each other. The carbon nanotubes 124 can be orderly or disorderly aligned. If the carbon nanotubes 124 are disorderly aligned, the carbon nanotubes 124 can be curved and entangled with each other. If the carbon nanotubes 124 are orderly aligned, the carbon nanotubes 124 can be aligned along one or more directions, with some variation.

The carbon nanotube composite film 120 can be a freestanding structure. The term "freestanding structure" means that the carbon nanotube composite film 120 can sustain the weight of itself when hoisted by a portion thereof without any significant damage to its structural integrity. For example, if the carbon nanotube composite film 120 is placed between two separate supports, a portion of the carbon nanotube composite film 120 not in contact with the two supports would be suspended between the two supports and maintain its structural integrity.

The carbon nanotube film structure of the carbon nanotube composite film 120 is also a freestanding structure. The carbon nanotube film structure is not functionalized by chemical treatment and can be a pure carbon nanotube film structure without any functional group.

The carbon nanotube film structure includes at least one carbon nanotube film. The carbon nanotube film structure can include 2 to 10 carbon nanotube films stacked with each other. In one embodiment, the carbon nanotube film structure includes 2 to 4 carbon nanotube films.

The carbon nanotube film can be a drawn carbon nanotube film which is a freestanding structure composed of a plurality of carbon nanotubes. The carbon nanotubes are arranged substantially parallel to a surface of the drawn carbon nanotube film. A large majority of the carbon nanotubes in the drawn carbon nanotube film can be oriented along a preferred orientation, meaning that a majority of the carbon nanotubes in the carbon nanotube film are arranged substantially along the same direction. An end of one carbon nanotube is joined to another end of an adjacent carbon nanotube arranged substantially along the same direction by van der Waals force.

Some variations can occur in the orientation of the carbon nanotubes in the drawn carbon nanotube film. Microscopically, the carbon nanotubes oriented substantially along the same direction may not be perfectly aligned in a straight line, and some curved portions may exist. It can be understood that a contact between some carbon nanotubes located substantially side by side and oriented along the same direction cannot be totally excluded.

Figure 4:
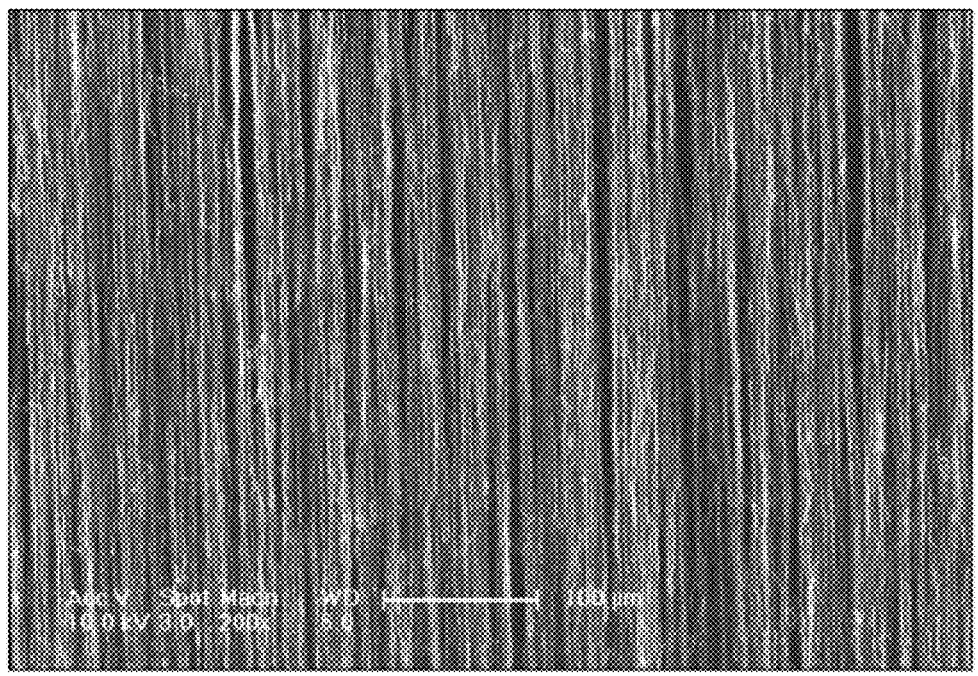
FIG. 4 is an SEM image of one embodiment of a carbon nanotube film.
Figure 5:
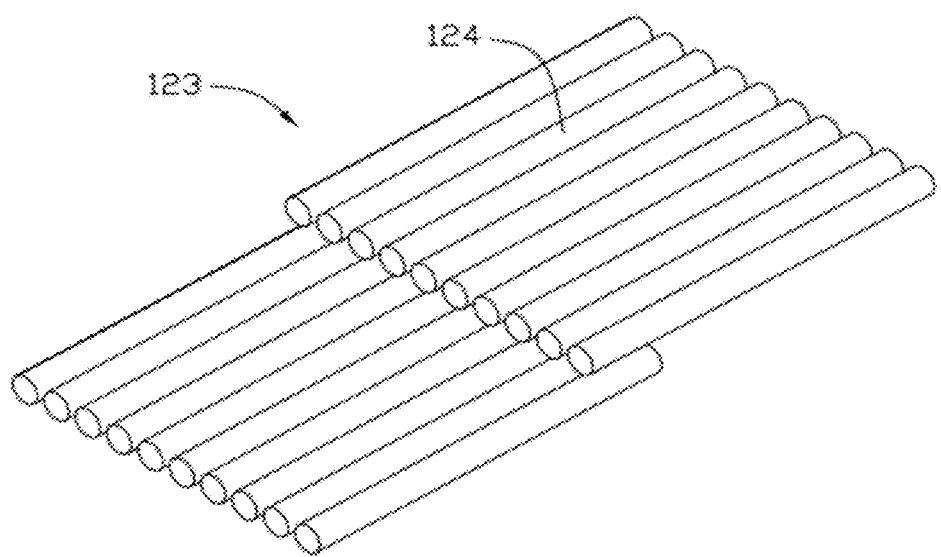
FIG. 5 is a schematic view of one embodiment of a carbon nanotube segment of the carbon nanotube film in FIG. 4.

Referring to FIG. 4 and FIG. 5, the drawn carbon nanotube film can include a plurality of successively oriented carbon nanotube segments 123 joined end-to-end by van der Waals force therebetween. Each carbon nanotube segment 123 includes a plurality of carbon nanotubes 124 substantially parallel to each other, and joined by van der Waals force therebetween. The carbon nanotubes 124 are oriented substantially along the same direction. The drawn carbon nanotube film can be drawn from a carbon nanotube array. The carbon nanotube segments 123 can vary in width, thickness, uniformity, and shape. The carbon nanotubes in the drawn carbon nanotube film are also substantially oriented along a preferred orientation. A thickness of the carbon nanotube film can range from about 1 nanometer to about 100 micrometers. In one embodiment, the thickness of the carbon nanotube film ranges from about 100 nanometers to about 10 micrometers. A width of the carbon nanotube film relates to the carbon nanotube array from which the drawn carbon nanotube film is drawn. In each carbon nanotube segment 123, a plurality of gaps exists between the two adjacent carbon nanotubes. The width of each of the gaps is less than 10 micrometers. Examples of a carbon nanotube film are taught by U.S. Pat. No. 7,045,108 to Jiang et al., and WO 2007015710 to Zhang et al.

Figure 6:
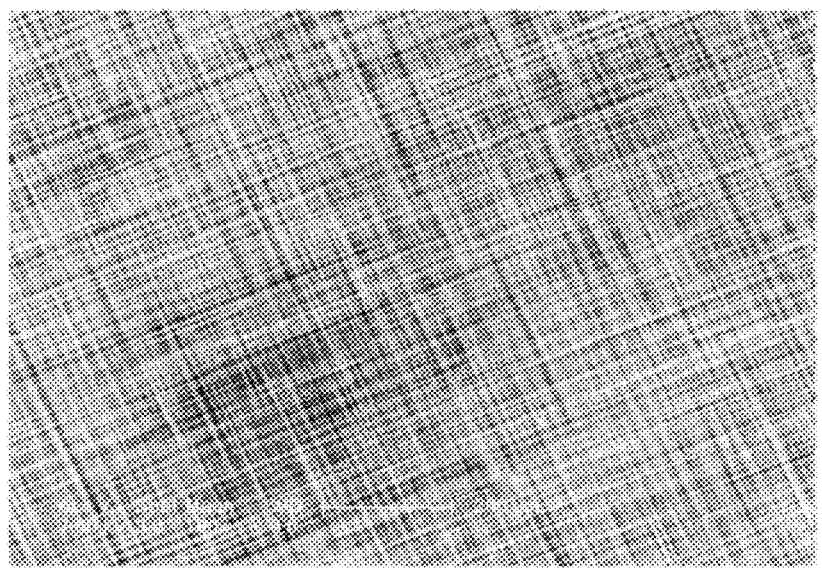
FIG. 6 is an SEM image of a carbon nanotube film structure including two stacked carbon nanotube films of FIG. 4, aligned along different directions.

Referring to FIG. 6, in one embodiment, the carbon nanotube composite film 120 includes at least two carbon nanotube films stacked with each other. An angle between the aligned directions of the carbon nanotubes in the two adjacent carbon nanotube films can range from about 0 degrees to about 90 degrees (0°≤α≤90°). In another embodiment, the carbon nanotube composite film 120 includes two carbon nanotube films stacked together at an angle of about 90 degrees, thus the two adjacent carbon nanotube films are substantially perpendicular to each other.

The nano-material layer 126 includes a plurality of nano particles forming a continuous layer structure. The nano-material layer 126 is coated on the surface of the carbon nanotubes 124. The nano-material layer 126 and the carbon nanotubes 124 can form a plurality of carbon nanotube composite fibers. The carbon nanotube composite film 120 includes a plurality of carbon nanotube composite fibers forming a mesh. The nano-material layer 126 at the intersection of two adjacent carbon nanotubes 124 is an integral structure. Thus, the stability of the carbon nanotube composite film 120 is improved. In one embodiment, the nano-material layer 126 is coated on the surface of each of the carbon nanotubes 124 continuously.

The material of the nano-material layer 126 has a chemical stability and includes DLC (Diamond-Like Carbon), diamond, silicon, silicon carbide, silicon dioxide, boron nitride and/or silicon nitride, etc. In one embodiment, the material of the nano-material layer 126 is an amorphous nano-material. The amorphous nano-material can reduce the effect of the lattice structure of the nano-material layer 126 during observation of the sample. The thickness of the nano-material layer 126 can range from about 1 nanometer to about 500 nanometers. In one embodiment, the thickness of the nano-material layer 126 ranges from about 20 nanometers to about 200 nanometers. The nano-material layer 126 is filled into the gaps between two adjacent carbon nanotubes 124. The inner walls of the gaps are coated with the nano-material layer 126. The nano-material layer 126 should be thin enough such that the gaps cannot be fully filled. Thus, the carbon nanotube composite film 120 still defines a plurality of micropores 122.

The size of the micropores 122 is smaller than the size of the gaps. The size of the micropores 122 can range from about 0.5 nanometers to about 1 micrometer. Among the plurality of micropores 122, at least 60% of the plurality of micropores 122 has a size smaller than 50 nanometers, and at least 80% of the plurality of micropores 122 has a size smaller than 100 nanometers. In one embodiment, at least 80% of the plurality of micropores 122 has a size smaller than 50 nanometers, and at least 90% of the plurality of micropores 122 has a size smaller than 100 nanometers. In one embodiment, the shape of the micropores 122 of the carbon nanotube composite film 120 is rectangular. The nano-material layer 126 can be deposited on the surface of the carbon nanotubes 124 by CVD (chemical vapor deposition) or PVD (physical vapor deposition) method. The TEM micro-grid 100 is suitable to observe the distribution of the nano particles with a size smaller than 100 nanometers.

In one embodiment, the material of the nano-material layer 126 is DLC. The surface of the carbon nanotubes 124 is completely coated by the DLC. The thickness of the DLC is about 1 nanometer to 100 nanometers. The DLC can improve the self-supporting property and wear resistance of the carbon nanotube composite film 120. In one embodiment, two layers of carbon nanotube films are stacked with each other and suspended in a reaction chamber, and the aligned direction of the carbon nanotubes in the two layers of carbon nanotube films are perpendicular to each other. The DLC is deposited on the surface of the carbon nanotubes 124 by the PECVD (Plasma Enhanced CVD) method.

The support 110 defines at least one through hole 112. The support 110 can be a grid structure or a metal sheet which defines at least one through hole 112. The support 110 can also be a metallic grid used in a typical TEM. The material of the metallic grid can be copper or any other metal materials which is suitable. The support 110 can also be a nonmetallic grid. The material of the nonmetallic grid can be ceramic, glass, or quartz. A surface of the support 110 is covered with the carbon nanotube composite film 120, thereby suspending portions of the carbon nanotube composite film 120 across the through holes 112. In one embodiment, both the size and the shape of the support 110 are the same as that of the carbon nanotube composite film 120. All the though holes 112 are covered by the carbon nanotube composite film 120. Furthermore, the diameter of the through hole 112 is larger than the size of the micropores 122. In one embodiment, the diameter of the through hole 112 ranges from about 10 micrometers to about 2 millimeters.

In one application of the TEM micro-grid 100, the sample is located on the surface of the TEM micro-grid 100. In detail, the sample is suspended on the micropores 122 of the carbon nanotube composite film 120 and contacts with the surface of the nano-material layer 126. The sample can be nano-scaled particles, such as nano-wires, nanotubes, or nano-balls. The material of the sample can be carbon, metal, ceramic, or semiconductive material. The size of the sample can be smaller than 1 micrometer. In one embodiment, the size of the sample is smaller than 100 nanometers.

Figure 7:
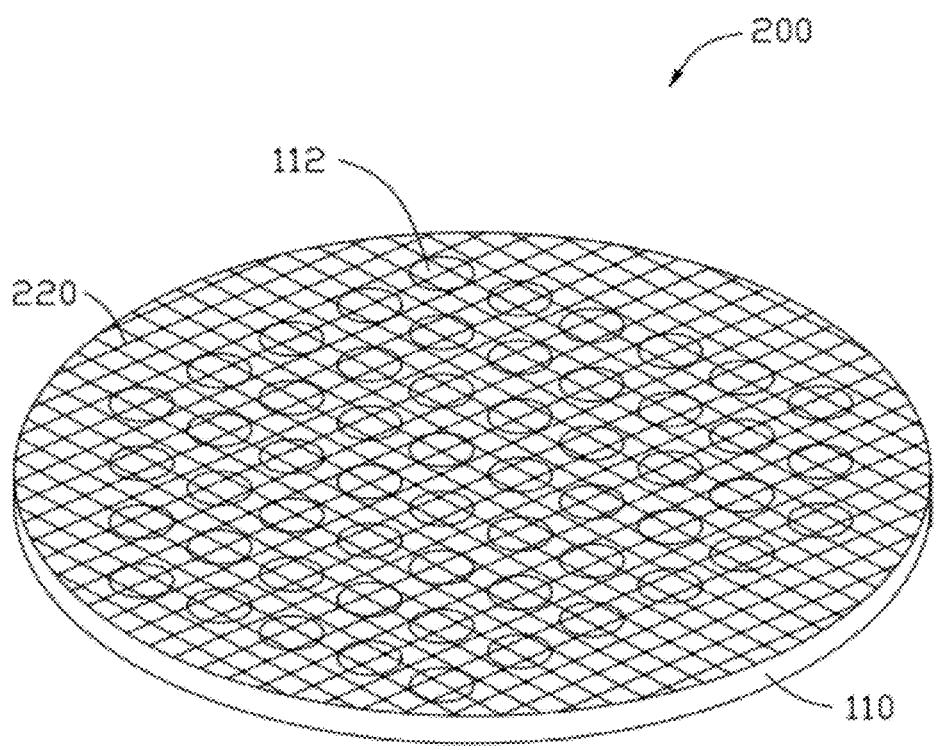
FIG. 7 is a schematic view of one embodiment of a TEM micro-grid.
Figure 8:
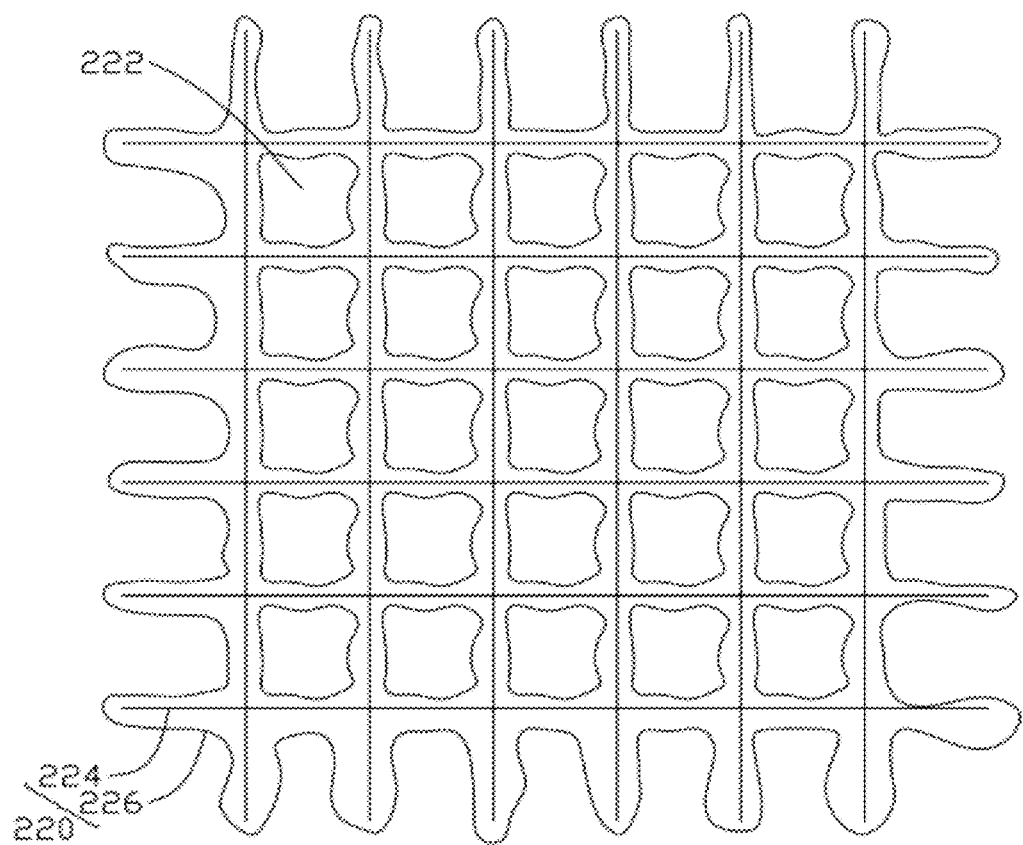
FIG. 8 is a schematic view of one embodiment of a carbon nanotube composite film.

Referring to FIG. 7 and FIG. 8, another embodiment of a TEM micro-grid 200 includes a support 110 and a carbon nanotube composite film 220 stacked together. The TEM micro-grid 200 is similar to the TEM micro-grid 100, except that the carbon nanotube composite film 220 includes a plurality of carbon nanotube wires 224 coated with nano-material layer 226. The plurality of carbon nanotube wires 224 forms a carbon nanotube film structure. The carbon nanotube film structure is a freestanding structure. The nano-material layer 226 is coated on the surface of the carbon nanotube wires 224. The carbon nanotube composite film 220 defines a plurality of micropores 222.

The carbon nanotube composite film 220 includes a plurality of carbon nanotube wires 224 intersecting with each other. In one embodiment, the carbon nanotube composite film 220 includes two layers of carbon nanotube wires 224 intersecting with each other and forming a plurality of micropores 222. The carbon nanotube wires 224 in the same layer are substantially parallel to each other. The aligned direction of the carbon nanotube wires 224 in different layers is substantially perpendicular to each other.

Figure 9:
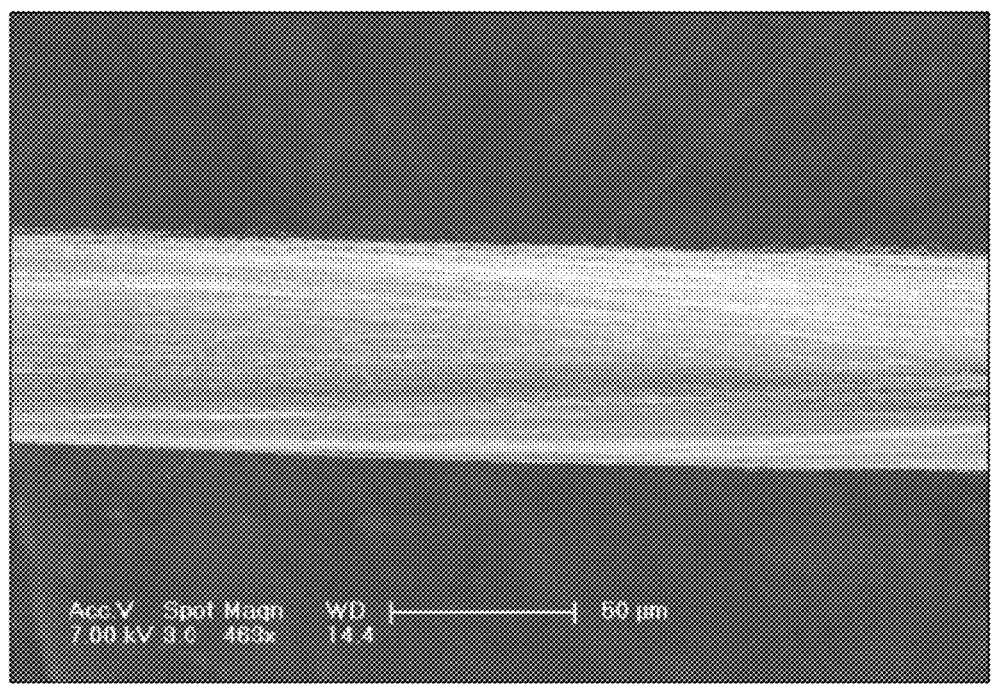
FIG. 9 is an SEM image of an untwisted carbon nanotube wire of one embodiment of a TEM micro-grid.

The carbon nanotube wire 224 can be an untwisted carbon nanotube wire or a twisted carbon nanotube wire. An untwisted carbon nanotube wire is formed by treating a carbon nanotube film with an organic solvent. Referring to FIG. 9, the untwisted carbon nanotube wire includes a plurality of successive carbon nanotubes, which are substantially oriented along the linear direction of the untwisted carbon nanotube wire and joined end-to-end by the van der Waals force therebetween. The untwisted carbon nanotube wire can have a diameter ranging from about 0.5 nanometers to about 100 micrometers. Examples of an untwisted carbon nanotube wire are taught by U.S. Pat. No. 7,045,108 to Jiang et al., and U.S. Pat. No. 7,704,480 to Jiang et al.

Figure 10:
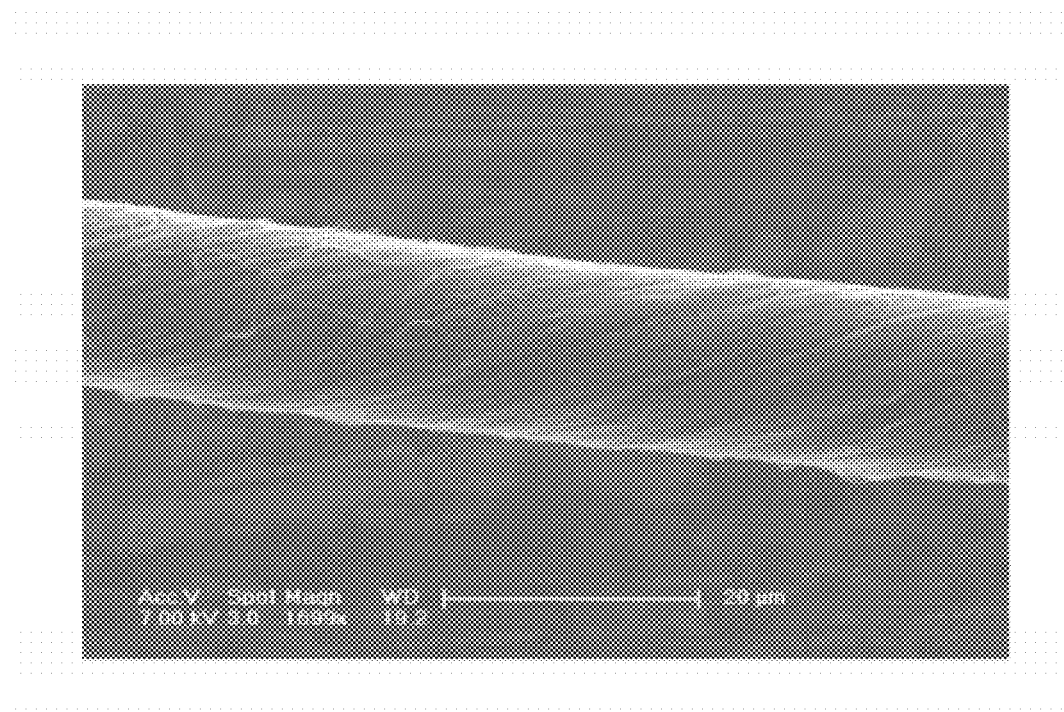
FIG. 10 is an SEM image of a twisted carbon nanotube wire of one embodiment of a TEM micro-grid.

A twisted carbon nanotube wire is formed by twisting a carbon nanotube film by using a mechanical force. Referring to FIG. 10, the twisted carbon nanotube wire includes a plurality of carbon nanotubes oriented around an axial direction of the twisted carbon nanotube wire. The length of the twisted carbon nanotube wire can be set as desired and the diameter of the carbon nanotube wire can range from about 0.5 nanometers to about 100 micrometers. The twisted carbon nanotube wire can be treated with an organic solvent before or after twisting.

The nano-material layer 226 is a continuous layer structure including a plurality of nano particles. The plurality of nano particles is coated on the surface of the carbon nanotube wire 224. At the intersection of two adjacent carbon nanotube wires 224, the nano particles of the nano material layer 226 on the surface of each carbon nanotube wire 224 are combined together to form an integral structure. Thus, the stability of the carbon nanotube composite film 220 is improved. The nano-material layer 226 can be deposited on the surface of the carbon nanotube wire 224. In one embodiment, a composite carbon nanotube wire can be fabricated by twisting the carbon nanotube composite film 120 described above with a mechanical force or with an organic solvent treatment. Thus the nano-material layer 226 is coated on the surface of each carbon nanotube. In one embodiment, the material nano-material layer 226 is DLC.

According to the above descriptions, the TEM micro-grid of the present disclosure has the following advantages. First, the carbon nanotube of the TEM micro-grid is coated with a layer of nano-material made from carbon nanotubes. Thus, the TEM micro-grid can be used to observe the carbon nanotube sample. Furthermore, the accuracy of a TEM adopting the TEM micro-grid can be improved. Second, the nano-material layer is integrated at the intersection of the two adjacent carbon nanotube layers, so the stability of the whole carbon nanotube composite film is improved. Third, because the carbon nanotube is coated with a nano-material layer, the micropores among the carbon nanotube film are relatively small, so the TEM micro-grid is suitable to observe the nano particles with a size smaller than 100 nanometers.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A transmission electron microscope (TEM) micro-grid comprising a grid and a carbon nanotube composite film stacked on the grid, wherein the carbon nanotube composite film comprises a carbon nanotube film structure and a nano-material layer coated on the carbon nanotube film structure.

2. The TEM micro-grid of claim 1, wherein the carbon nanotube composite film covers a surface of the grid.

3. The TEM micro-grid of claim 1, wherein the carbon nanotube film structure is a freestanding structure comprising a plurality of carbon nanotubes joined end-to-end by van der Waals force.

4. The TEM micro-grid of claim 3, wherein the nano-material layer is coated on a surface of each of the plurality of carbon nanotubes.

5. The TEM micro-grid of claim 1, wherein the nano-material layer is coated on the whole carbon nanotube film structure.

6. The TEM micro-grid of claim 1, wherein the nano-material layer is a continuous layer.

7. The TEM micro-grid of claim 1, wherein a thickness of the nano-material layer ranges from about 1 nanometer to about 500 nanometers.

8. The TEM micro-grid of claim 1, wherein the carbon nanotube composite film defines a plurality of micropores.

9. The TEM micro-grid of claim 8, wherein a size of each of the plurality of micropores ranges from about 0.5 nanometers to about 1 micrometer.

10. The TEM micro-grid of claim 9, wherein at least 60% of the plurality of micropores in the carbon nanotube composite film has a size less than 50 nanometers.

11. The TEM micro-grid of claim 9, wherein at least 80% of the plurality of micropores in the carbon nanotube composite film has a size less than 100 nanometers.

12. The TEM micro-grid of claim 1, wherein a material of the nano-material layer is selected from the group consisting of diamond-like carbon, diamond, silicon, silicon carbide, silicon dioxide, boron nitride and silicon nitride.

13. The TEM micro-grid of claim 1, wherein the carbon nanotube film structure comprises two carbon nanotube films stacked and intersected with each other, and each of the two carbon nanotube films comprises a plurality of carbon nanotubes aligned substantially along the same direction and joined end to end by van der Waals force.

14. The TEM micro-grid of claim 1, wherein the carbon nanotube film structure comprises a plurality of carbon nanotube wires intersected with each other.

15. The TEM micro-grid of claim 14, wherein the carbon nanotube film structure comprises two layers of carbon nanotube wires intersected with each other, the carbon nanotube wires in a first of the two layers are parallel to each other, and the carbon nanotube wires in a second of the two layers are perpendicular to the carbon nanotube wires in the first layer.

16. The TEM micro-grid of claim 14, wherein a surface of each of the plurality of carbon nanotube wires is coated with the nano-material layer.

17. The TEM micro-grid of claim 14, wherein each of the plurality of carbon nanotube wires comprises a plurality of carbon nanotubes joined end-to-end by van der Waals force, and a surface of each of the plurality of carbon nanotubes is coated with the nano-material layer.

18. A transmission electron microscope (TEM) micro-grid comprising a support and a carbon nanotube composite film, wherein the support defines at least one through holes the carbon nanotube composite film covers the at least one through hole, the carbon nanotube composite film comprises a plurality of carbon nanotube composite fibers forming a mesh structure, and each of the plurality of carbon nanotube composite fibers comprises a carbon nanotube coated with a nano-material layer.

19. A transmission electron microscope (TEM) micro-grid comprising:
- a support defining at least one through hole;
- a carbon nanotube film structure covering the at least one through hole; and
- a nano-material layer coated on a surface of the carbon nanotube film structure.

20. The TEM micro-grid of claim 19, wherein a diameter of the at least one through hole ranges from about 10 micrometers to about 2 millimeters.

* * * * *